(12) United States Patent
Kim et al.

(10) Patent No.: US 12,531,361 B2
(45) Date of Patent: Jan. 20, 2026

(54) ELECTRICAL CONTACT TERMINAL HAVING ELASTICITY AND MOUNTING STRUCTURE THEREOF

(71) Applicant: JOINSET CO., LTD., Ansan-si (KR)

(72) Inventors: Sun-Ki Kim, Gunpo-si (KR); Byung-Joo Park, Ansan-si (KR); Hyoung-Kyu Kim, Ansan-si (KR); Jin-San Kim, Ansan-si (KR)

(73) Assignee: JOINSET CO., LTD. (KR)

( * ) Notice: Subject to any disclaimer, the term of this patent is extended or adjusted under 35 U.S.C. 154(b) by 385 days.

(21) Appl. No.: 18/121,172

(22) Filed: Mar. 14, 2023

(65) Prior Publication Data

US 2023/0299526 A1    Sep. 21, 2023

(30) Foreign Application Priority Data

Mar. 15, 2022  (KR) .................. 10-2022-0032360
Mar. 22, 2022  (KR) .................. 10-2022-0035629

(51) Int. Cl.
*H01R 13/213*    (2006.01)
*H01R 13/24*    (2006.01)

(52) U.S. Cl.
CPC ....... *H01R 13/213* (2013.01); *H01R 13/2464* (2013.01)

(58) Field of Classification Search
CPC ...................................................... H05K 3/341
USPC ....................................................... 439/314
See application file for complete search history.

(56) References Cited

U.S. PATENT DOCUMENTS 10,212,863 B1 *   2/2019  Ball ...................... H05K 9/009

FOREIGN PATENT DOCUMENTS

KR           101074162      * 10/2011
KR           101591658 B1   *  2/2016

* cited by examiner

*Primary Examiner* — Tulsidas C Patel
*Assistant Examiner* — Thaslimur Rahman
(74) *Attorney, Agent, or Firm* — Park & Associates IP Law Office

(57) ABSTRACT

Disclosed is an electrical contact terminal having elasticity, which is fitted into a through-hole defined on a substrate so as to electrically connect a conductive pattern defined on the substrate to an object. A core of the electrical contact terminal includes a body part having a first width with a uniform dimension in a longitudinal direction, an insertion part having a second width with a dimension less than that of the first width and extending vertically downward from the body part, and a contact part protruding in the form of a wing from each of both sides of an end of the insertion part in a width direction, wherein the body part, the insertion part, and the contact part are provided as a single body.

11 Claims, 7 Drawing Sheets

ELECTRICAL CONTACT TERMINAL HAVING ELASTICITY AND MOUNTING STRUCTURE THEREOF

REFERENCE TO RELATED APPLICATIONS

This application claims the priority benefit of Korean Patent Application No. 10-2022-0032360 filed on Mar. 15, 2022 and Korean Patent Application No. 10-2022-0035629 filed on Mar. 22, 2022, the entire contents of which are incorporated herein by reference.

FIELD OF THE INVENTION

The present invention relates to an electrical contact terminal having elasticity, and more particularly, to an electrical contact terminal which is soldered on a substrate and electrically connected to an electrically conductive object disposed on a lower portion of the substrate.

BACKGROUND OF THE INVENTION

In recent years, as an electrical contact terminal capable of reflow soldering, an elastic electrical contact terminal equipped with a heat-resistant rubber core having elasticity and having a rubber hole formed therein is applied to various electrical devices.

An electrical contact terminal disclosed in Korean Patent No. 1591658 by the present applicant is electrically connected to an object disposed on a bottom surface of a circuit board through a through-hole formed in the circuit board.

However, there are disadvantages in that it is difficult to electrically connect the electrical contact terminal disclosed in this patent to a circuit pattern formed on the bottom surface of the circuit board, and the electrical contact terminal does easily come out of the through-hole before soldering.

In addition, the electrical contact terminal has a shape in which a bottom surface thereof is recessed toward a middle portion thereof, and thus may be slanted either of the left and right sides depending on the degree of lead rise at both edges of the bottom surface during soldering, and when the electrical contact terminal is soldered in such a state, a contact protrusion is tilted in the through-hole, so that there is a disadvantage in that when pressed by the object on a lower portion, the electrical contact terminal interferes by the through-hole.

In addition, since soldering is performed around pointed portions of the both the edges, when the electrical contact terminal is pushed up by the object on the lower portion of the circuit board, the soldering strength thereagainst is weak.

In addition, since an edge portion on which the contact protrusion forms the boundary together with a bottom surface of a core is rounded with a relatively large radius of curvature, and the through-hole of the circuit board is formed vertically, when the contact protrusion is inserted into the through-hole to mount the electrical contact terminal, the corresponding edge portion has to be in contact with the edge of an entrance of the through-hole of the circuit board, and as a result, there are limitations in that the contact protrusion may be tilted inside the through-hole depending on the contact position, and the height of the contact protrusion protruding from an exit of the through-hole varies every time.

Although it is possible to increase in diameter of the through-hole so that the edge portion is not in contact with the edge of the through-hole entrance of the circuit board, if the through-hole is enlarged, a clearance by which the contact protrusion of the electrical contact terminal may move left and right becomes too large, which is not good, and if the diameter of the through-hole increases, it is not possible to use the circuit board efficiently. Therefore, there is a limit to increasing in diameter of the through-hole of the circuit board.

In addition, since a polymer film is bonded to a portion including the bottom surface and both edges of the core, there is a limitation in that an object disposed on an upper portion of the circuit board and the object disposed therebelow are not electrically connected.

Since recent electrical devices and electronic devices have compact and slim appearances or have various shapes, various structures have been proposed to remove unnecessary electromagnetic waves or perform electrical grounding, and for example, there is a need to electrically connect a ground pattern on an top surface of a circuit board to an electrically conductive object disposed on a bottom surface of the circuit board without passing through an electrically conductive via-hole.

In addition, an electrical contact terminal capable of electrically connecting a grounding pattern disposed on a top surface or a bottom surface of a circuit board to an electrically conductive object disposed to face the other direction or the same direction of the circuit board is required.

That is, there is a need for an economical component and a method capable of electrically connecting a grounding pattern formed on a top surface or a bottom surface of a circuit board to a required place, breaking away from a typical method.

SUMMARY OF THE INVENTION

Therefore, an object of the present invention is to provide an electrical contact terminal capable of being evenly soldered with less movement on a molten solder during soldering.

Another object of the present invention is to provide an electrical contact terminal capable of being vertical without being tilted in a through-hole during soldering.

A further another object of the present invention is to provide an electrical contact terminal capable of economically and electrically connecting ground patterns formed on the upper and bottom surfaces of a substrate.

A further another object of the present invention is to provide an electrical contact terminal capable of being easily inserted into a through-hole of a substrate without easily coming out of the through-hole without soldering.

According to an aspect of the present invention, there is provided an electrical contact terminal having elasticity, which is mounted to be physically fitted into a through-hole of a substrate so as to be electrically connected to a conductive pattern disposed adjacent to the through-hole on the substrate, the electrical contact terminal including a core having elasticity and heat resistance and provided with an electrically conductive layer on the outermost surface thereof, wherein the core includes a body part having a first width with a uniform dimension in a longitudinal direction, an insertion part having a second width with a dimension less than that of the first width and extending vertically downward from the body part, and a contact part protruding in the form of a wing from each of both sides of an end of the insertion part in a width direction, wherein the body part, the insertion part, and the contact part are provided as a single body, and the electrically conductive layer is disposed across a bottom surface of the body part, the insertion part, and the contact part to electrically connect the body part, the insertion part, and the contact part to each other.

A buffer hole may be defined in at least one of the body part, the insertion part, or the contact part in the longitudinal direction.

The contact part may have a V-shaped cross-section.

The electrically conductive layer may be a metal layer disposed on an outer surface of a polymer film, wherein the polymer film may be bonded to an outer surface of the core by an adhesive interposed therebetween, or the electrically conductive layer may be an electrically conductive fabric, and may be bonded to an outer surface of the core by an adhesive interposed therebetween.

According to another aspect of the present invention, there is provided an electrical contact terminal having elasticity, which is mounted to be physically fitted into a through-hole of a substrate so as to be electrically connected to a conductive pattern disposed adjacent to the through-hole on the substrate, the electrical contact terminal including a core having elasticity and heat resistance and provided with an electrically conductive layer on the outermost surface thereof, wherein the core includes a body part, an insertion part protruding downward from the body part, a contact part protruding in the form of a wing from each of both sides of an end of the insertion part in a width direction, wherein the body part, the insertion part, and the contact part are provided as a single body, the electrically conductive layer is disposed across a bottom surface of the body part, the insertion part, and the contact part to electrically connect the body part, the insertion part, and the contact part to each other, in a state in which the insertion part is fitted into the through-hole, the electrical contact terminal is physically mounted on the substrate by elastic restoration force of the contact part, and the electrically conductive layer is configured to electrically connect the first and second conductive patterns disposed adjacent to the through-hole on the top surface and the bottom surface of the substrate, respectively.

According to another aspect of the present invention, there is provided an electrical contact terminal having elasticity, which is mounted to be physically fitted into a through-hole of a substrate so as to be electrically connected to a conductive pattern disposed adjacent to the through-hole on the substrate, the electrical contact terminal including a core having elasticity and heat resistance and provided with an electrically conductive layer on the outermost surface thereof, wherein the core includes a body part having a horizontal portion formed on a bottom surface thereof, and an insertion part extending vertically downward from the body part, wherein the body part and the insertion part are provided as a single body, and the electrically conductive layer is disposed across the horizontal portion of the body part and the insertion part to electrically connect the body part and the insertion part to each other.

A buffer hole may be defined in the insertion part in a longitudinal direction.

An edge portion in which the insertion part defines a boundary together with a bottom surface of the body part may have an angle closer to a right angle, and a radius of curvature of the edge portion may be less than a clearance defined by a thickness of the conductive pattern and solder cream.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

It should be noted that the technical terms used herein are used only to describe specific embodiments, and are not intended to limit the present invention. In addition, unless specifically defined otherwise in the present invention, technical terms used in the present invention should be interpreted as meanings commonly understood by those skilled in the art to which the present invention belongs, and should not be interpreted as excessively comprehensive meanings or excessively reduced meanings. In addition, when the technical terms used in the present invention are incorrect technical terms that do not accurately express the spirit of the present invention, the terms should be replaced with technical terms to be correctly understood by those skilled in the art. In addition, general terms used in the present invention should be interpreted as defined in the dictionary or in context before and after, and should not be interpreted as excessively reduced meanings.

Hereinafter, the present invention will be described in detail with reference to the accompanying drawings.

Figure 1:
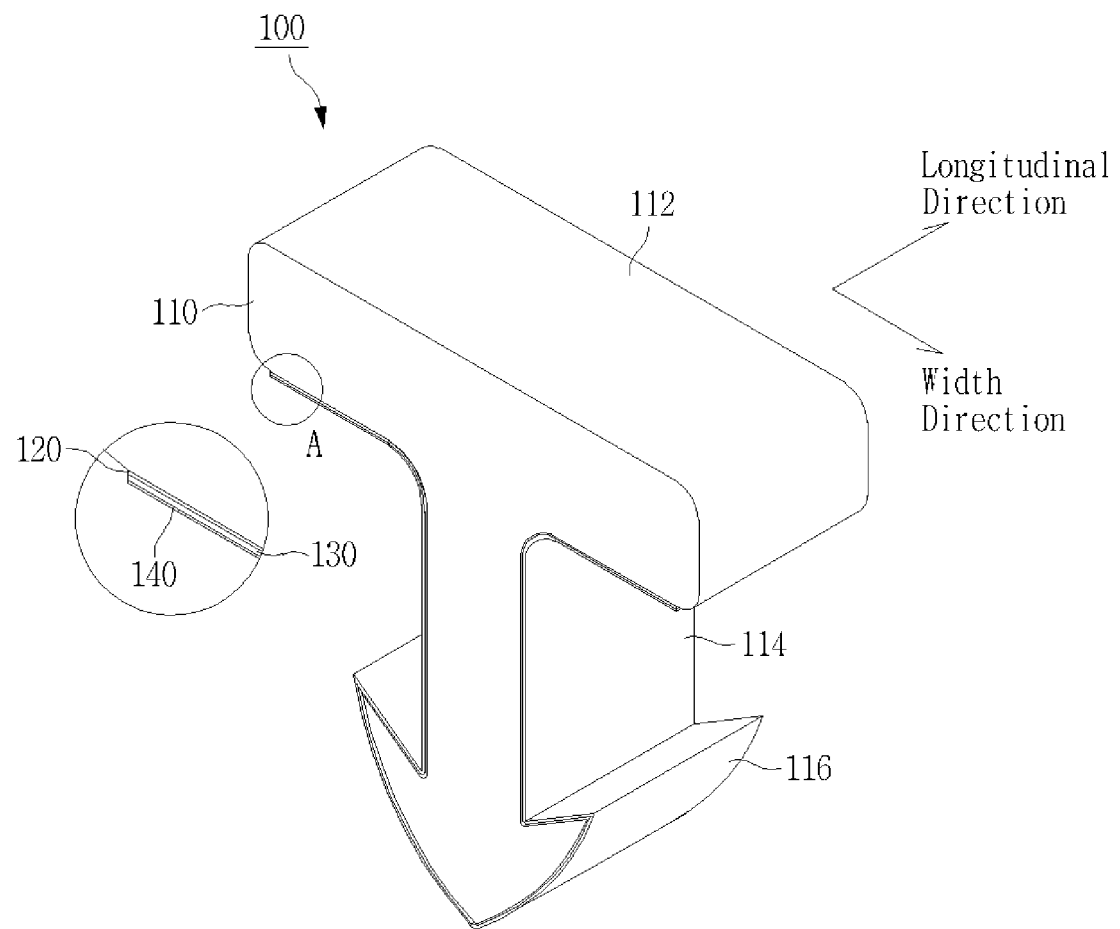
FIG. 1 shows an electrical contact terminal according to an embodiment of the present invention.
Figure 2:
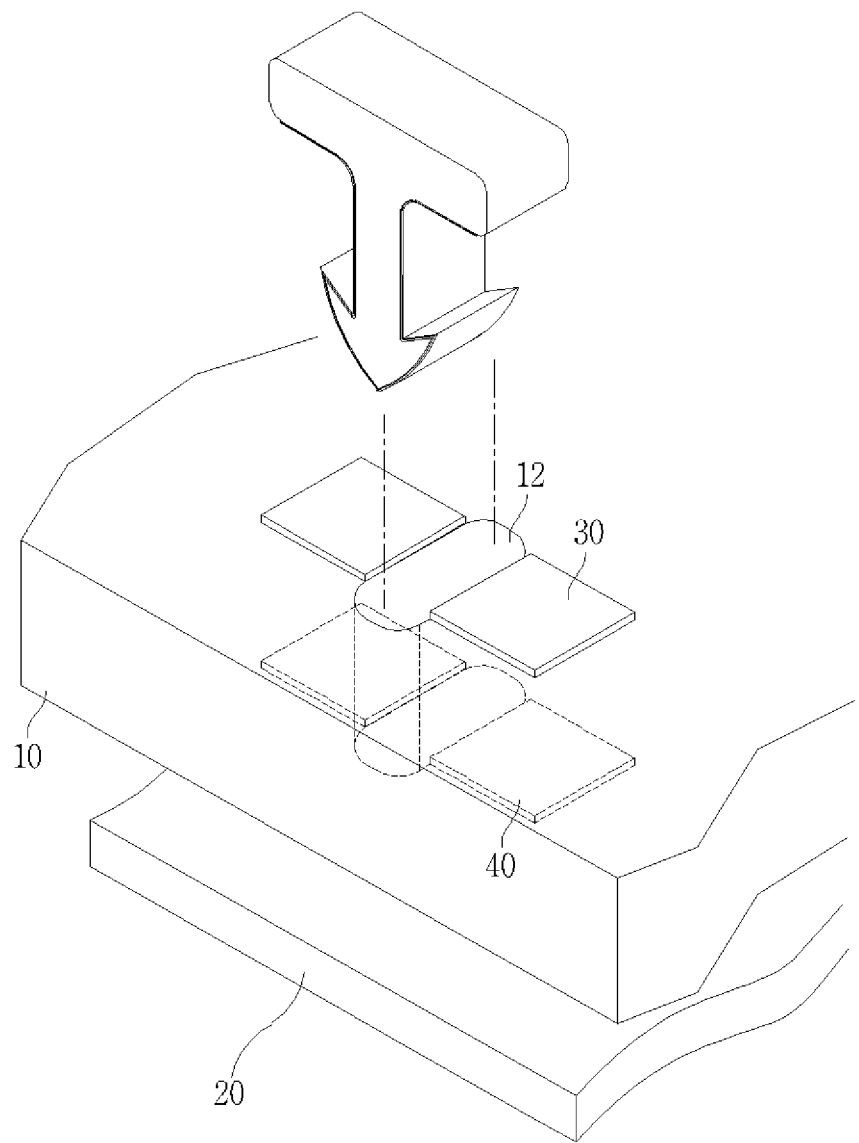
FIG. 2 schematically shows a structure in which the electrical contact terminal is mounted on a substrate.

FIG. 1 shows an electrical contact terminal according to an embodiment of the present invention, FIG. 2 schematically shows a structure in which the electrical contact terminal is mounted on a substrate, and FIGS. 3A to 3D show a structure in which the electrical contact terminal is mounted on the substrate in detail.

An electrical contact terminal 100 is mounted to be physically inserted into a through-hole 12 of a substrate 10 so as to electrically connect a conductive pattern 30 disposed on a top surface of the substrate 10 to a conductive pattern 40 disposed on a bottom surface, which are disposed adjacent to the through-hole 12, or to electrically connect an electrically conductive object disposed on either the top surface or the bottom surface of the substrate 10 to the conductive patterns 30 and 40.

Here, the substrate 10 may be a PCB that is thin, semi-rigid, or hard such as FPCB, and may have a thickness of about 0.08 mm to about 2 mm.

The electrical contact terminal 100 is constituted by a core 110 having elasticity and heat resistance, and a heat-resistant polymer film 130 bonded to an outer surface of the core 110 by an adhesive 120 interposed therebetween in a longitudinal direction, and as shown in the enlarged circle, a metal layer 140 capable of soldering is disposed on an outer surface, that is, an exposed surface, of the polymer film 130.

The core 110, the polymer film 130, and the metal layer 140 have heat resistance against the soldering, and the metal layer 140 may be soldered.

Unlike the present embodiment, an electrical contact terminal, in which an electrically conductive fabric is applied instead of the polymer film 130 having the metal layer 140 disposed on the outer surface thereof, and the conductive fabric surrounds the core 110 by being bonded to the outer surface of the core 110 by the adhesive 120 interposed therebetween, may be applied.

Hereinafter, each component of the electrical contact terminal 100 will be described in detail.

The core 110 is made of an elastic material, has heat resistance and insulation, and is functionally constituted by a body part 112, an insertion part 114, and a contact part 116, which are provided as a single body.

The material of the core 110 may be non-foamed heat-resistant rubber having heat resistance and elasticity for reflow soldering, for example, silicone rubber, and may have hardness of Shore A 40 to 70 for suitable mechanical strength and elasticity.

The body part 112, the insertion part 114, and the contact part 116 constituting the core 110 have the same length along a longitudinal direction of the core 110, and may be manufactured at the same time as a single body by extruding and curing a silicone gum.

As to be described later, the electrical contact terminal 100 is fitted into the through-hole 12 of the substrate 10 by manual work or SMT, and a horizontally flat pick-up surface is provided on a top surface of the body part 112 for vacuum pick-up during surface mounting.

The body part 112 has a first width with a uniform dimension in the longitudinal direction, and the insertion part 114 has a second width less than the first width.

In the present embodiment, the polymer film 130 and the metal layer 140 are disposed across the insertion part 114 and the contact part 116 from a bottom surface of the body part 112.

Here, the 'bottom surface' refers to a portion that is substantially involved in the soldering when the electrical contact terminal 100 is soldered and mounted onto the substrate 10.

However, without being limited thereto, the polymer film 130 and the metal layer 140 may extend up to a side surface or the top surface of the body part 112, and when extending to the top surface, both ends of the polymer film 130 and the metal layer 140 are spaced apart from each other.

When the metal layer 140 extends to the side surface and the top surface of the body part 112, the top surface of the body part 112 may serve as an electrical contact by being pressed by an object facing the top surface.

The insertion part 114 is provided by protruding vertically downward from the bottom surface of the body part 112, and the protruding position may be an intermediate portion of the bottom surface of the body part 112 as shown in the present embodiment. However, the embodiment of the present invention is not limited thereto, and the insertion part 114 may be provided by protruding while being slanted to one side of the bottom surface.

The insertion part 114 may have a width less than that of the through-hole 12 of the substrate 10 to easily pass through the through-hole 12.

The contact part 116 may protrude in the form of a wing from each of both sides of an end of the insertion part 114 in a width direction, and may have a V-shaped cross-section as shown in the present embodiment.

Here, the dimension of the largest width of the V-shape is naturally larger than the dimension of the width of the through-hole 12, so that the electrical contact terminal 100 does not come out of the through-hole 12 during transportation, movement, and work after being inserted by fitting.

The contact part 116 may pass through the through-hole 12 in a folded state and be restored to its original state by elastic restoration force, and thus is ultimately electrically connected to the conductive pattern 40 disposed on the bottom surface of the substrate 10 by the elastic restoration force.

A buffer hole penetrated in a longitudinal direction may or may not be defined inside the body part 112, the insertion part 114 and the contact part 116, which constitute the core 110. If the buffer hole is defined, there are advantages of reducing a raw material, reducing a weight, and reducing force pressing the top surface.

Particularly, when the buffer hole is defined in the longitudinal direction inside the body part 112, the buffer hole may function as a gasket in a protruding state on the top surface of the substrate 10.

In addition, when the buffer hole is defined in the insertion part 114 and the contact part 116, it is easy to insert the electrical contact terminal 100 into the through-hole 12.

Hereinafter, the electrical contact terminal according to an embodiment of the present invention mounted on the substrate to provide various electrical connections will be described.

Figure 3A:
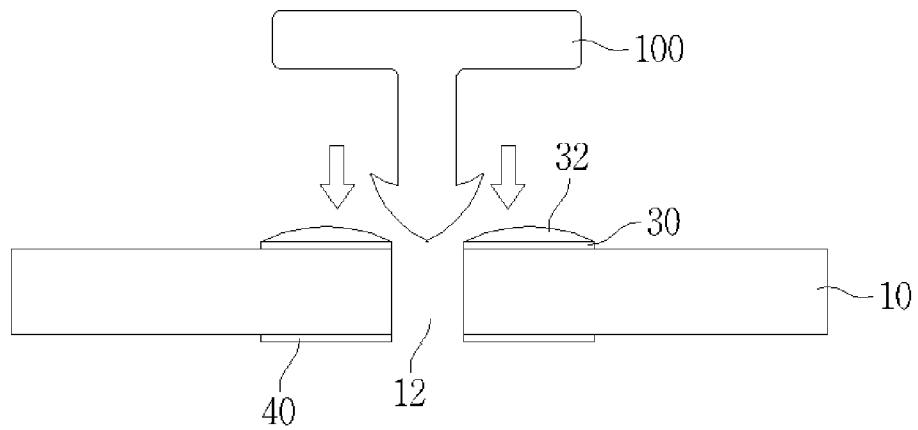
FIGS. 3A to 3D show a structure in which the electrical contact terminal is mounted on the substrate in detail.

Referring to FIG. 3A, the through-hole 12 is defined in the substrate 10, the conductive pattern 30 is disposed on the top surface of the substrate 10 so as to be adjacent to the through-hole 12, and the conductive pattern 40 is disposed on the bottom surface of the substrate 10.

The conductive pattern 40 collectively refers to a pattern constituting a conductive path through which electricity (including a signal) passes, and becomes a grounding pattern when constituting a grounding circuit.

Electrically conductive objects 20 and 22 may be disposed on an upper portion and a lower portion of the substrate 10, respectively, and the object 22 disposed on the upper portion physically and electrically is in contact with the body part 112, and the object 20 disposed on the lower portion is in physical and electrical contact with the contact part 116.

As described above, the electrical contact terminal 100 is reel-taped on a tape carrier and supplied to be vacuum picked-up by a pick-up device or fitted into the through-hole 12 of the substrate 10 by manual work.

When such a portion protruding to the outside of the electrical contact terminal 100 is in contact with the object, there is an advantage of absorbing mechanical force applied from the outside, and when soldered and mounted on the substrate, there is an advantage of easy repairing.

In addition, the electrical contact terminal 100 has good mechanical and electrical reliability, and thus, is easily applied to automobiles subjected to vibration and impacts, or to relatively large computers and industrial electronic devices.

Figure 3B:
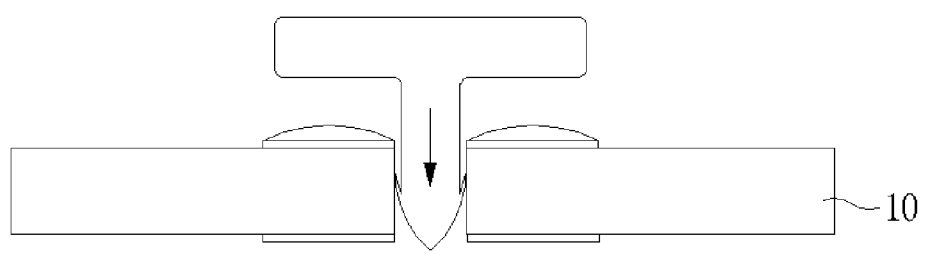

As shown in FIG. 3B, the insertion part 114 passes through the through-hole 12 by applying a pressure. Here, the contact part 116 is folded inward to pass through the through-hole 12.

Figure 3C:
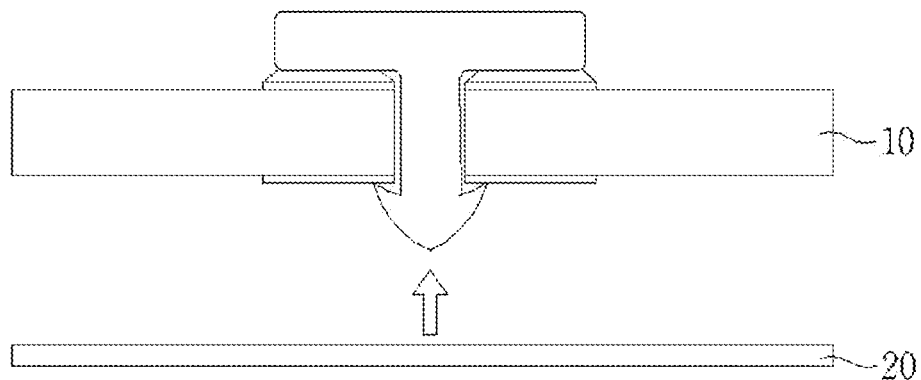

Referring to FIG. 3C, the contact part 116 is unfolded by the elastic restoration force after passing through and coming out of the through-hole 12.

In the above state, the metal layer 140 of the body part 112 is electrically connected to the conductive pattern 30 on the top surface of the substrate 10, and the metal layer 140 of the contact part 116 is electrically connected to the conductive pattern 40 on the bottom surface of the substrate 10.

Alternatively, solder cream 32 may be applied on the conductive pattern 30 of the substrate 10, and the metal layer 140 on the bottom surface of the body part 112 of the electrical contact terminal 100 may be subjected to reflow soldering while being placed on the applied solder cream 32.

When the metal layer 140 of the bottom surface of the body part 112 is soldered, the contact part 116 does not lift or move when pressed by opposing force from a lower portion of the substrate, so that there is an advantage in that the electrical resistance does not increase or change.

Figure 3D:
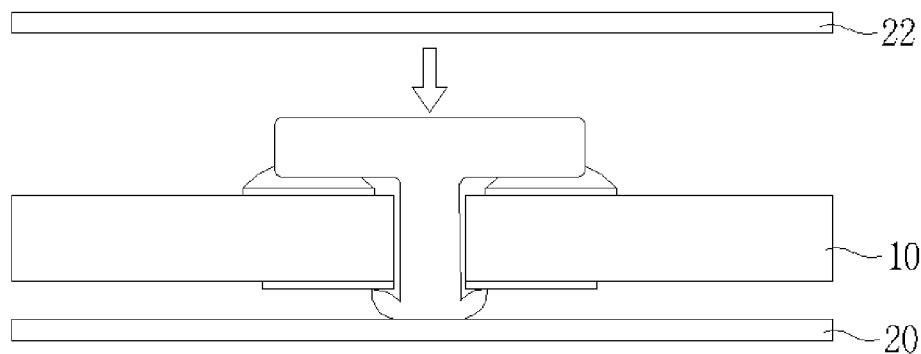

Referring to FIGS. 3C and 3D, the electrically conductive objects 20 and 22 may be disposed on the upper portion, the lower portion, or both the upper and lower portions of the substrate 10 and be physically and electrically connected to the body part 112 and the contact part 116 of the electrical contact terminal 100.

According to the mounting structure of the electrical contact terminal, the following electrical connection is possible.

1) The conductive pattern 30 on the top surface of the substrate 10 and the conductive pattern 40 on the bottom surface thereof may be electrically connected to each other.

2) The conductive pattern 30 on the top surface of the substrate 10 may be electrically connected to the electrically conductive object 22 on the upper portion of the substrate 10, and the conductive pattern 40 on the bottom surface of the substrate 10 may be electrically connected to the electrically conductive object 20 on the lower portion of the substrate 10.

Of course, in this case, each of the electrically conductive objects 20 and 22 is electrically connected by pressing the body part 112 and the contact part 116 of the electrical contact terminal 100, as shown in FIGS. 3C and 3D.

3) The conductive pattern 30 on the top surface of the substrate 10 may be electrically connected to the electrically conductive object 20 on the lower portion of the substrate 10, and the conductive pattern 40 on the bottom surface of the substrate 10 may be electrically connected to the electrically conductive object 22 on the upper portion of the substrate 10.

Here, it goes without saying that two or more of the electrical connections described above may be combined to create a new configuration.

Figure 4:
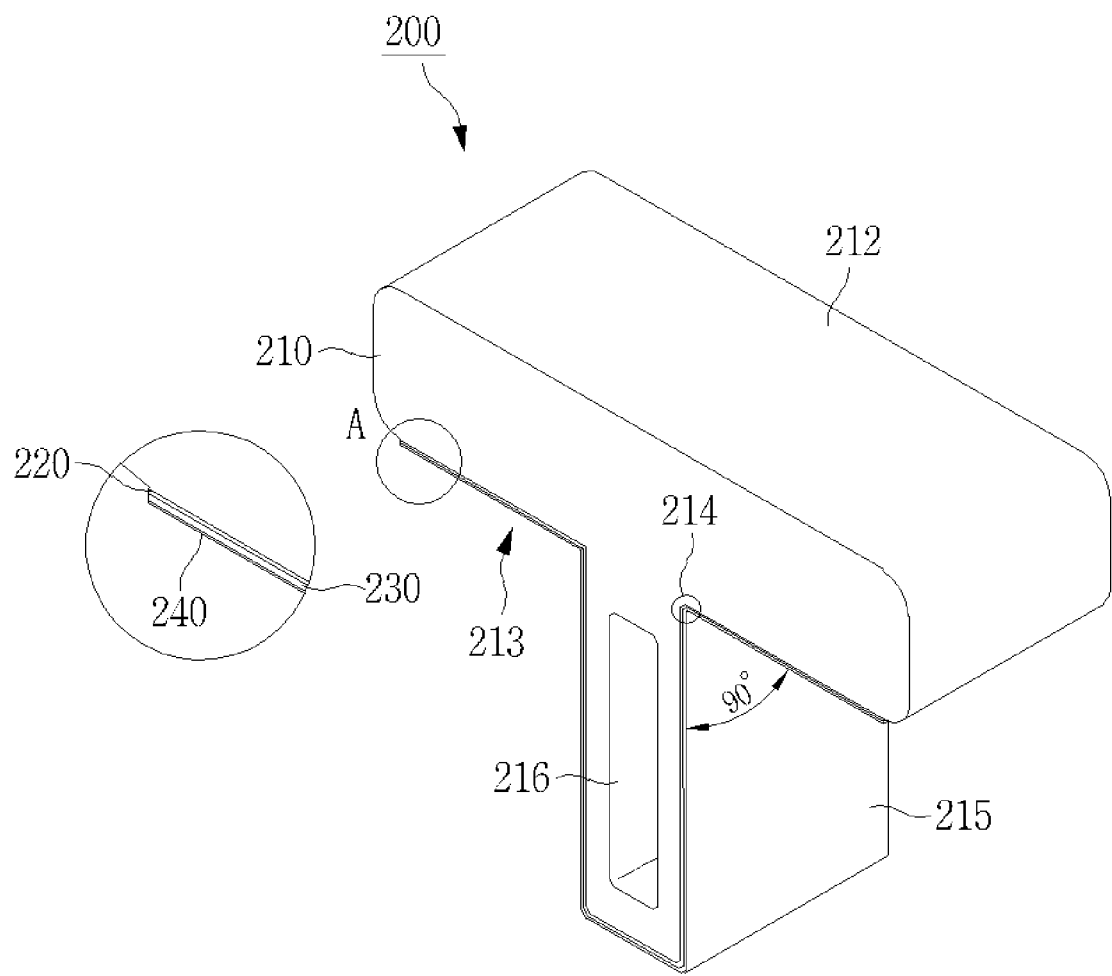
FIG. 4 shows an electrical contact terminal according to another embodiment of the present invention.
Figure 5A:
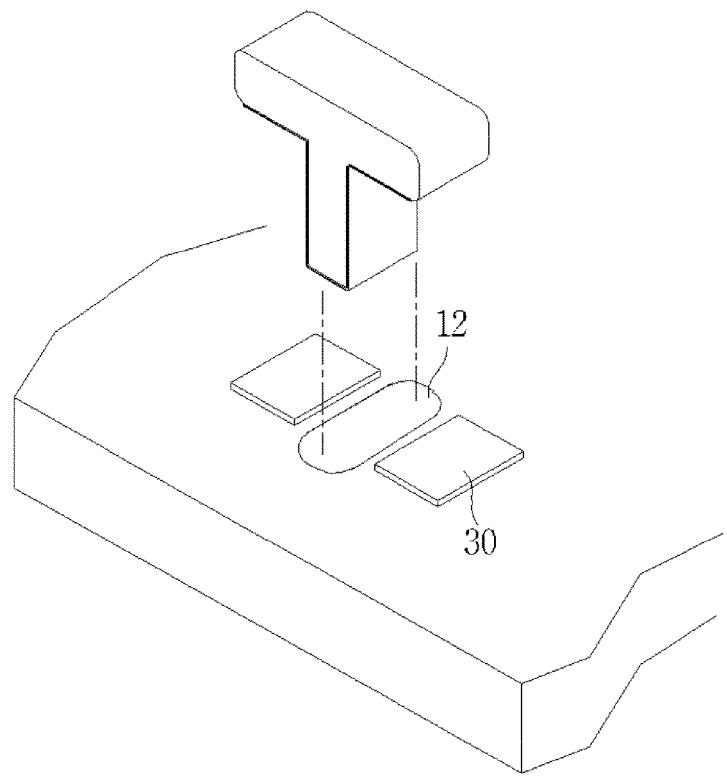
FIGS. 5A and 5B schematically show a structure in which an electrical contact terminal is mounted on a substrate, respectively.
Figure 5B:
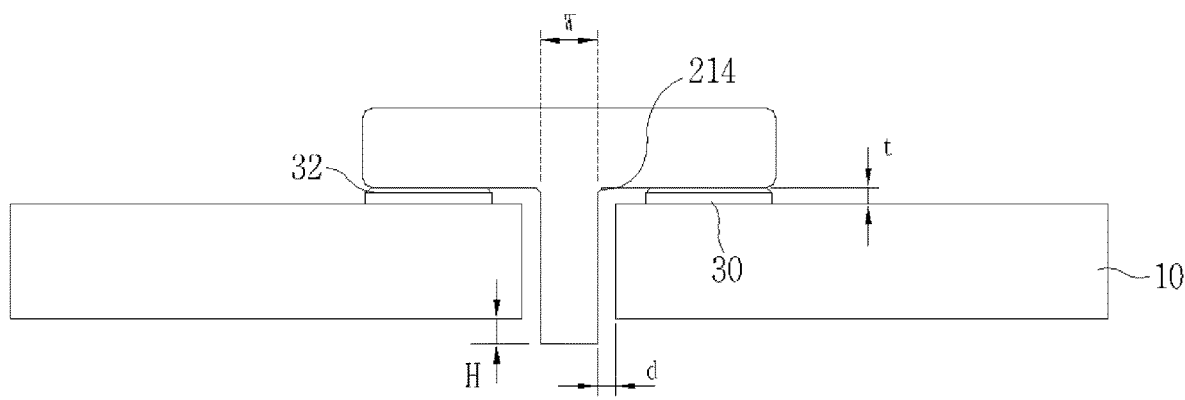

FIG. 4 shows an electrical contact terminal according to another embodiment of the present invention, FIGS. 5A and 5B each schematically shows a structure in which the electrical contact terminal is mounted on a substrate, and FIGS. 6A to 6D show a structure in which the electrical contact terminal is mounted on the substrate in detail.

In the present embodiment, an electrical contact terminal 200 is mounted to be physically fitted into a through-hole 12 of a substrate 10 and soldered to a conductive pattern 30 disposed adjacent to the through-hole 12 on a top surface of the substrate 10 to electrically connect an electrically conductive object 20 disposed on a lower portion of the substrate 10 to the conductive pattern 30.

In addition, if necessary, electrically conductive objects respectively disposed on the upper portion and the lower portion of the substrate 10 may be electrically connected to each other.

The electrical contact terminal 200 is constituted by a core 210 having elasticity and heat resistance, and a heat-resistant polymer film 230 bonded to a bottom surface of the core 210 by an adhesive 220 interposed therebetween in a longitudinal direction, and as shown in the enlarged circle, a metal layer 240 capable of soldering is disposed on an outer surface, that is, an exposed surface, of the polymer film 230.

The core 210, the polymer film 230, and the metal layer 240 have heat resistance against the soldering, and the metal layer 240 may be soldered.

As described above, an electrical contact terminal, in which an electrically conductive fabric is applied instead of the polymer film 230 having the metal layer 240 disposed on the outer surface thereof, and the conductive fabric surrounds the core 210 by being bonded to the outer surface of the core 210 by the adhesive 220 interposed therebetween, may be applied.

Hereinafter, each component of the electrical contact terminal 200 will be described in detail.

The core 210 is made of an elastic material, has heat resistance and insulation, and is functionally constituted by a body part 212, and an insertion part 215, which are provided as a single body.

In the present embodiment, the core 210 has a T-shaped cross-section, and particularly, the body part 212 has a rectangular or square cross-section so that a bottom surface of the body part 212 is horizontal.

The material of the core 210 may be non-foamed heat-resistant rubber having heat resistance and elasticity for reflow soldering, for example, silicone rubber, and may have hardness of Shore A 40 to 70 for suitable mechanical strength and elasticity.

The body part 212 and the insertion part 215, which constitute the core 210, have the same length along a longitudinal direction of the core 210, and may be manufactured at the same time as a single body by extruding and curing a silicone gum.

As to be described later, the electrical contact terminal 200 is fitted into the through-hole 12 of the substrate 10 by manual work or SMT, and a horizontally flat pick-up surface is provided on a top surface of the body part 212 for vacuum pick-up during surface mounting.

In the present embodiment, the polymer film 230 and the metal layer 240 are disposed across the insertion part 215 from a bottom surface of the body part 212.

Here, as shown in FIG. 1, the 'bottom surface' refers to a horizontal portion 213 of a bottom surface of the electrical contact terminal 200, excluding both edge portions.

In the present embodiment, the electrical contact terminal 200 is soldered to the substrate 10 to a uniform height on a large area of the entire horizontal portion 213.

Therefore, when the insertion part 215 is lifted from bottom to top after the soldering, the body part 212 is applied with uniform force, and thus, is easily balanced without being tilted in the through-hole 12.

In addition, the height of the insertion part 215 protruding from an exit of the through-hole 12 may always be constant.

In addition, since the soldering is performed only on the horizontal portion 213, the insertion part 215 is not tilted to one side during the soldering, and thus may consistently and vertically passes through the through-hole 12 after the soldering.

Since the polymer film 230 and the metal layer 240 are disposed on the horizontal portion 213 of the electrical contact terminal 200, material cost is low, and manufacturing is facilitated.

In addition, when compared to the above patent, since the bottom surface of the body part 212 is flat, the height of the body part 212 protruding from the top surface of the substrate 10 is low, and as a result, the height of the electrical contact terminal 200 as a gasket may be minimized.

Referring to FIGS. 4 and 5, the insertion part 215 is provided by protruding vertically downward from the bottom surface of the body part 212, so that an edge portion 214 in which the insertion part 215 defines a boundary with the bottom surface of the body part 212 has an approximate right angle.

In other words, since a radius of curvature of the edge portion 214 is set to a value close to 0, it is possible to allow the edge portion 214 to have the approximate right angle if not the exact right angle.

As a result, as shown in FIG. 5 B, the edge portion 214 hardly in contact with an edge of an entrance of the through-hole 12 of the substrate 10.

Particularly, since a clearance t is provided by a thickness of the conductive pattern 30 on the top surface of the substrate 10 and the solder cream 32, when the radius of curvature of the edge portion is set to be smaller than the clearance t, the edge portion 214 is hardly in contact with the edge of the entrance of the through hole 12 of the substrate 10 even if a distance d between the insertion part 215 and a sidewall of the through-hole 12 is set to be small.

As such, since the edge portion 214 in which the insertion part 215 defines the boundary with the bottom surface of the body part 212 is not in contact with the edge of the entrance of the through-hole 12 of the substrate 10, the insertion part 215 is not tilted inside the through-hole 12 by the contact with the edge during the soldering.

In addition, when an inner end of the conductive pattern 30 is disposed to be spaced apart from the through-hole 12, only the horizontal portion 213 of the electrical contact terminal 200 is soldered to define a space that is not soldered from the inner end of the conductive pattern 30, and thus, when lifted from the bottom to the top of the through-hole 12, the space that is not soldered is lifted to absorb external force.

Referring to FIG. 4, a buffer hole 216 penetrated in a longitudinal direction may be defined inside the insertion part 215. As a result, there are advantages of reducing a raw material, reducing a weight, and facilitating the insertion of the electrical contact terminal 200 into the through-hole 12.

A buffer hole may be defined in the body part 212 constituting the core 210. In this case, the buffer hole may function as a gasket in a protruding state on the top surface of the substrate 10.

Hereinafter, the electrical contact terminal of the present invention mounted on the substrate to provide various electrical connections will be described.

Figure 6A:
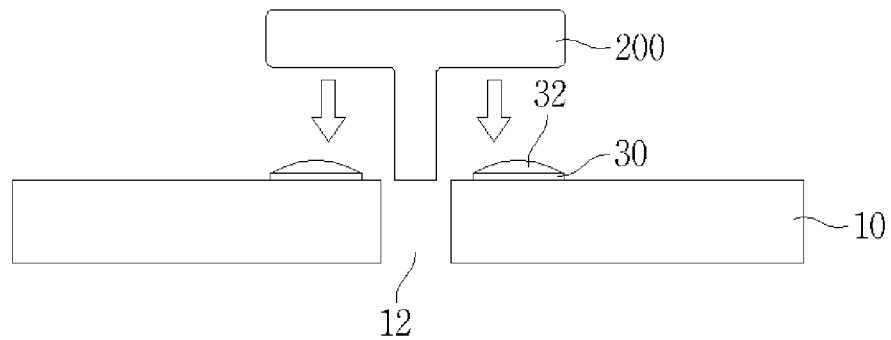
FIGS. 6A to 6C show a structure in which the electrical contact terminal is mounted on the substrate in detail.

Referring to FIG. 6A, the through-hole 12 is defined in the substrate 10, the conductive pattern 30 is disposed on the top surface of the substrate 10 so as to be adjacent to the through-hole 12.

The conductive pattern 30 collectively refers to a pattern constituting a conductive path through which electricity (including a signal) passes, and becomes a grounding pattern when constituting a grounding circuit.

The electrically conductive object 20 is disposed on the lower portion of the substrate 10 and physically and electrically contacts the end of the insertion part 115.

Unlike the present embodiment, an electrically conductive object may be disposed on the upper portion of the substrate 10 and be in physical and electrical contact with the body part 212. In this case, the polymer film 230 and the metal layer 240 may extend up to the top surface of the body part 212 via a side surface thereof.

Therefore, in the electrical contact terminal 200, the metal layer 240 extends up to the top surface of the body part 212, so that the top surface of the body part 212 functions as a gasket by being pressed by the object facing the top surface.

The electrical contact terminal 200 is reel-taped on a tape carrier and supplied to be vacuum picked-up by a pick-up device or the insertion part 215 is fitted into the through-hole 12 of the substrate 10 by manual work, and the metal layer 240 disposed on the horizontal portion 214 of the bottom surface of the body part 212 is placed on the solder cream 32 applied on the conductive pattern 30.

Figure 6B:
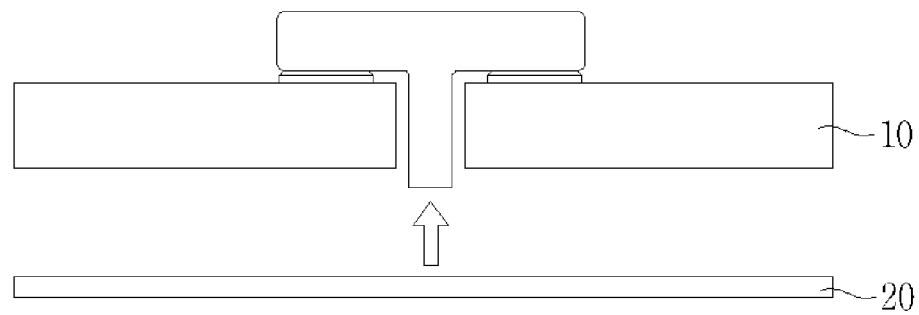

As shown in FIG. 6B, the metal layer 240 on the bottom surface of the body part 212 of the electrical contact terminal 200 is reflow soldered while being placed on the applied solder cream 32, and since an electrical path through which the conductive pattern 30—the metal layer 240—the electrically conductive object 20 are electrically connected to each other is determined by the soldering, there is an advantage in that the electrical resistance does not increase or change.

Figure 6C:
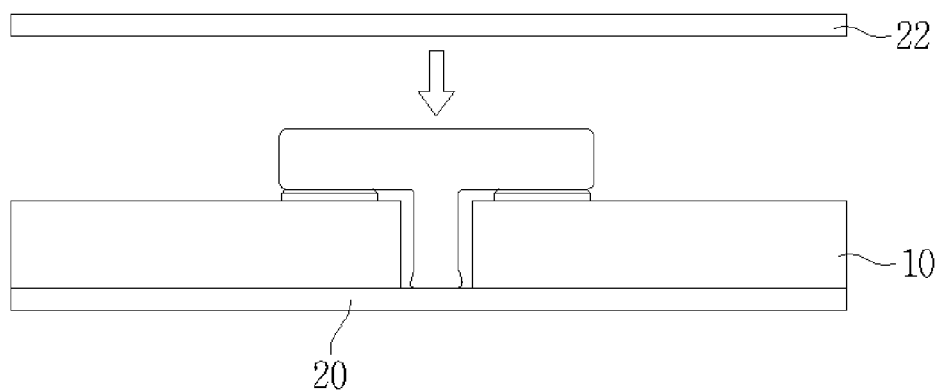

Thereafter, as shown in FIG. 6C, an end of the insertion part 215 is physically and electrically connected by being pressed by applying a pressure to the electrically conductive object 20 from a lower side of the substrate 10.

According to the mounting structure of the electrical contact terminal described above, the conductive pattern 30 on the top surface of the substrate 10 may be electrically connected to the electrically conductive object 20 on the lower portion of the substrate 10.

As described above, when the electrical contact terminal 200 has the structure in which the polymer film 230 and the metal layer 240 extend from the side surface of the body part 212 to the top surface thereof, the following connection is possible.

1) The conductive pattern 30 on the top surface of the substrate 10 is electrically connected to the electrically conductive object 20 on the upper portion or lower portion of the substrate 10.

2) The electrically conductive objects on the upper portion and the lower portion of the substrate 10 are electrically connected to each other.

The electrical contact terminal of the present invention has good mechanical and electrical reliability, and thus, is easily applied to automobiles subjected to vibration and impacts, or to relatively large computers and industrial electronic devices.

According to the embodiment of the present invention, there are following effects.

1) The conductive pattern formed on the top surface or the bottom surface of the substrate may be electrically and economically connected to the electrically conductive object disposed to face the other direction or the same direction of the substrate.

2) The conductive pattern disposed on the upper and bottom surfaces of the substrate may be efficiently, reliably, electrically connected. That is, the electrical contact terminal may be easy to be electrically connected to the conductive pattern disposed on the bottom surface of the substrate by the wing of the contact part.

3) Even if not soldered by the wing of the contact part, the electrical contact terminal may not come out of the through-hole during a process.

4) The electrical contact terminal may be soldered, and the protruding portion may easily absorb the mechanical impact of the object.

5) Due to the buffer hole, the less pressing force may be required, and the pressing may be performed well, so that the contact area with the object increases, thereby reducing the electrical contact resistance and allowing the easy insertion.

According to another embodiment of the present invention, there are following effects.

1) The entire horizontal portion of the bottom surface of the electrical contact terminal may be soldered to the substrate at the uniform height and over the large area.

2) When the insertion part is lifted from bottom to top after the soldering, the body part may be applied with the uniform force due to the uniform soldering, and thus, may be easily balanced without being tilted in the through-hole.

3) Since the soldering is performed at the uniform height, the height of the insertion part protruding from the exit of the through-hole may always be constant.

4) Since the soldering is performed only on the horizontal portion of the bottom surface of the electrical contact terminal, the insertion part may not be tilted to one side during the soldering, so that the insertion part consistently and vertically passes through the through-hole after the soldering.

Although the embodiment of the present invention has been described above, various changes or modifications may be made by those skilled in the art. As long as such changes and modifications do not fall outside the scope of the present invention, they can be said to belong to the present invention. The scope of the present invention should be determined by the claims set forth below.

What is claimed is:

1. An electrical contact terminal having elasticity and configured to mount to a through-hole of a substrate for electrically connecting to a conductive pattern disposed adjacent to the through-hole of the substrate, the electrical contact terminal comprising:
    a core having elasticity and heat resistance and provided with an electrically conductive layer on the outermost surface thereof,
    wherein the core comprises:
        a body part having a first width;
        an insertion part having a second width with a dimension less than that of the first width and extending vertically downward from the body part; and
        a contact part in the form of a pair of wings protruding from a distal end of the insertion part in a width direction, wherein the body part, the insertion part, and the contact part are provided as a single body, and the electrically conductive layer is disposed on a bottom surface of the body part, the insertion part, and the contact part to electrically connect the body part, the insertion part, and the contact part to each other,
    wherein a through-hole is defined in the substrate, and first and second conductive patterns are disposed adjacent to the through-hole on a top surface and a bottom surface of the substrate, respectively; and
    the insertion part of the electrical contact terminal is fitted into the through-hole so that the body part is electrically connected to the first conductive pattern, and the contact part is electrically connected to the second conductive pattern by elastic restoration force.

2. The electrical contact terminal of claim 1, wherein the electrical contact terminal is configured to:
    1) electrically connect the first conductive pattern and the second conductive pattern to each other;
    2) electrically connect the first conductive pattern to an electrically conductive object on an upper portion of the substrate, and electrically connect the second conductive pattern to an electrically conductive object on a lower portion of the substrate;
    3) electrically connect the first conductive pattern to an electrically conductive object on the lower portion of the substrate, and electrically connect the second conductive pattern to an electrically conductive object on the upper portion of the substrate; or
    4) provide an electrical connection through a combination of 1) to 3).

3. The electrical contact terminal of claim 2, wherein the electrically conductive layer on the bottom surface of the body part is bonded to the first conductive pattern by soldering, and
    the electrically conductive layer of the contact part is electrically connected to the second conductive pattern by physical elasticity.

4. An electrical contact terminal having elasticity and configured to mount to a through-hole of a substrate for electrically connecting to a conductive pattern disposed adjacent to the through-hole on the substrate, the electrical contact terminal comprising:
    a core having elasticity and heat resistance and provided with an electrically conductive layer on the outermost surface thereof,
    wherein the core comprises:
        a body part;
        an insertion part protruding downward from the body part;
        a contact part in the form of a pair of wings protruding from a distal end of the insertion part in a width direction,
    wherein the body part, the insertion part, and the contact part are provided as a single body,
    wherein the electrically conductive layer is disposed on across a bottom surface of the body part, the insertion part, and the contact part to electrically connect the body part, the insertion part, and the contact part to each other,
    wherein in a state in which the insertion part is fitted into the through-hole, the electrical contact terminal is physically mounted on the substrate by elastic restoration force of the contact part, and the electrically conductive layer is configured to electrically connect first and second conductive patterns disposed adjacent to the through-hole on the top surface and the bottom surface of the substrate, respectively, to each other.

5. The electrical contact terminal of claim 4, wherein the electrically conductive layer is a metal layer disposed on an outer surface of a polymer film, wherein the polymer film is bonded to an outer surface of the core by an adhesive interposed therebetween.

6. The electrical contact terminal of claim 1, wherein a buffer hole is defined in at least one of the body part, the insertion part, or the contact part in the longitudinal direction.

7. The electrical contact terminal of claim 1, wherein the contact part has a V-shaped cross-section.

8. The electrical contact terminal of claim 1, wherein the electrically conductive layer is a metal layer disposed on an outer surface of a polymer film, wherein the polymer film is bonded to an outer surface of the core by an adhesive interposed therebetween.

9. The electrical contact terminal of claim 1, wherein the electrically conductive layer is an electrically conductive fabric and is bonded to an outer surface of the core by an adhesive interposed therebetween.

10. The electrical contact terminal of claim 1, wherein an inner end of the first conductive pattern is placed to be spaced apart from the through-hole, and soldering is performed only on the bottom surface of the body part to provide the electrical connection between the electrical contact terminal and the conductive pattern.

11. The electrical contact terminal of claim 10, wherein a non-soldering space is defined on the bottom surface of the body part from an inner end of the first conductive pattern to the through-hole so that, when the insertion part is lifted upwardly by the electrically conductive object, the non-soldering space is lifted to absorb external force by the electrically conductive object.

\* \* \* \* \*